(12) United States Patent
Lesso

(10) Patent No.: US 10,149,050 B2
(45) Date of Patent: Dec. 4, 2018

(54) TEMPERATURE MONITORING FOR LOUDSPEAKERS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 3 days.

(21) Appl. No.: 15/315,845

(22) PCT Filed: Jun. 4, 2015

(86) PCT No.: PCT/GB2015/051629
§ 371 (c)(1),
(2) Date: Dec. 2, 2016

(87) PCT Pub. No.: WO2015/185931
PCT Pub. Date: Oct. 12, 2015

(65) Prior Publication Data
US 2017/0105068 A1    Apr. 13, 2017

(30) Foreign Application Priority Data
Jun. 6, 2014    (GB) .................................. 1410110.9

(51) Int. Cl.
*H04R 3/00* (2006.01)
*H04R 29/00* (2006.01)
(Continued)

(52) U.S. Cl.
CPC ........... *H04R 3/007* (2013.01); *H03F 3/2173* (2013.01); *H03G 3/3005* (2013.01);
(Continued)

(58) Field of Classification Search
CPC ........ G01K 13/00; G01K 7/16; H03G 3/3005; H03G 5/165; H03G 9/025; H03G 3/20;
(Continued)

(56) References Cited

U.S. PATENT DOCUMENTS 4,406,921 A * 9/1983 von Recklinghausen ................... H04R 29/003 381/121
4,887,298 A * 12/1989 Haigler ................. H03G 3/301 330/207 P (Continued)

FOREIGN PATENT DOCUMENTS

| CN | 102149035 A | * 8/2011 | ............... H03F 1/30 |
| EP | 1799013 A1 | 6/2007 | |
| EP | 2357726 A1 | 8/2011 | |

OTHER PUBLICATIONS

International Search Report and Written Opinion of the International Searching Authority, International Application No. PCT/GB2015/051629, dated Aug. 12, 2015.

(Continued)

*Primary Examiner* — Yogeshkumar Patel
(74) *Attorney, Agent, or Firm* — Jackson Walker L.L.P.

(57) ABSTRACT

This application relates to methods and apparatus for determining the temperature of a voice coil of a loudspeaker (204), for instance as part of a system (208) for protecting the loudspeaker from overheating. The method comprises driving the voice coil with signal components at first and second frequencies, wherein the first frequency ($f_H$) is higher than the second frequency ($f_L$), and determining first and second indications of current ($I_{CM}$) and voltage ($V_{CM}$) of the voice coil at said first and second frequencies respectively. The method involves determining an estimated ratio value using the first and second indications of current and voltage, wherein said estimated ratio value corresponds to a ratio between a value based on the resistance of the voice coil and a value based on the inductance of the voice coil. The temperature of the voice coil is then determined based on said estimated ratio value and at least one reference value. An impedance extraction module (210) may extract (Continued)

values for the impedance at the first and second frequencies respectively ($Z_H$, $Z_L$). In some embodiments a module (212) may determine estimated values of the resistance ($R_{EM}$) and inductance ($L_{EM}$) of the voice coil which are used by temperature estimation block (214) to determine the temperature.

50 Claims, 5 Drawing Sheets

(51) Int. Cl.
    *H03G 3/30*     (2006.01)
    *H03F 3/217*     (2006.01)

(52) U.S. Cl.
    CPC ..... *H04R 29/003* (2013.01); *H03F 2200/456* (2013.01); *H04R 2499/11* (2013.01)

(58) Field of Classification Search
    CPC ........ H03G 3/001; H03G 3/00; H04R 29/001; H04R 3/00; H04R 3/007; H04R 2499/11; H04R 29/003; H04R 3/002; H04R 9/06; H03F 2200/03; H03F 2200/462; H03F 2200/426; H03F 2200/468; H03F 2200/321; H03F 2200/471; H03F 1/52; H03F 2203/45638; H03F 3/2173; H03F 3/3005
    USPC ..................................... 381/55, 59; 330/284
    See application file for complete search history.

(56) References Cited

U.S. PATENT DOCUMENTS

| | | | | |
|---|---|---|---|---|
| 7,173,411 B1* | 2/2007 | Pond | ................. | H03K 17/9502 |
| | | | | 324/207.12 |
| 9,609,450 B2* | 3/2017 | Yeh | ...................... | H04R 29/003 |
| 9,794,687 B2* | 10/2017 | Napoli | .................. | H04R 3/007 |
| 9,807,528 B1* | 10/2017 | Jensen | ................. | H04R 29/003 |
| 2002/0071568 A1* | 6/2002 | Shuttleworth | ....... | H04R 29/001 |
| | | | | 381/58 |
| 2003/0142832 A1* | 7/2003 | Meerkoetter | ........ | H04R 29/003 |
| | | | | 381/59 |
| 2004/0178852 A1 | 9/2004 | Neunaber | | |
| 2005/0031117 A1* | 2/2005 | Browning | ........... | H04M 1/6016 |
| | | | | 379/391 |
| 2005/0031131 A1* | 2/2005 | Browning | ................ | H04R 3/08 |
| | | | | 381/59 |
| 2005/0031132 A1* | 2/2005 | Browning | ................ | H04R 3/08 |
| | | | | 381/59 |
| 2005/0031133 A1* | 2/2005 | Browning | ........... | H04R 29/003 |
| | | | | 381/59 |
| 2005/0031134 A1* | 2/2005 | Leske | ...................... | H04R 9/00 |
| | | | | 381/59 |
| 2005/0031138 A1* | 2/2005 | Browning | ................ | H04R 3/08 |
| | | | | 381/96 |
| 2005/0031140 A1* | 2/2005 | Browning | ................ | H04R 3/08 |
| | | | | 381/96 |
| 2006/0104451 A1* | 5/2006 | Browning | ........... | H04R 29/003 |
| | | | | 381/59 |
| 2010/0194413 A1* | 8/2010 | Dalbjorn | ................... | H03F 1/52 |
| | | | | 324/713 |
| 2011/0194705 A1* | 8/2011 | Gautama | ................... | H03F 1/30 |
| | | | | 381/59 |
| 2011/0228945 A1* | 9/2011 | Mihelich | ................ | H04R 3/002 |
| | | | | 381/59 |
| 2012/0020488 A1* | 1/2012 | Huijser | ................... | H04R 3/007 |
| | | | | 381/59 |
| 2013/0077796 A1* | 3/2013 | Risbo | ................... | H03G 11/008 |
| | | | | 381/55 |
| 2013/0329898 A1* | 12/2013 | Williams | ............... | H04R 9/022 |
| | | | | 381/59 |
| 2014/0086418 A1* | 3/2014 | Lubberhuizen | ........ | H04R 9/022 |
| | | | | 381/55 |
| 2014/0126730 A1* | 5/2014 | Crawley | ............... | H04R 29/001 |
| | | | | 381/59 |
| 2015/0146875 A1* | 5/2015 | Gautama | ................ | H04R 3/007 |
| | | | | 381/58 |
| 2015/0215704 A1* | 7/2015 | Magrath | ................. | H04R 9/022 |
| | | | | 381/55 |
| 2016/0127833 A1* | 5/2016 | Yasuda | ................ | H04R 29/003 |
| | | | | 381/59 |
| 2017/0150284 A1* | 5/2017 | Polleros | ............... | H04R 29/003 |
| 2017/0303057 A1* | 10/2017 | Crawley | ............... | H04R 29/001 |

OTHER PUBLICATIONS

Gottfried Behler, "Measuring the Loudspeaker's Impedance during Operation for the Derivation of the Voice Coil Temperature", AES, NY, NY, Feb. 25, 1995, Feb. 28, 1995.

Klippel et al., "Nonlinear Modeling of the Heat Transfer in Loudspeakers", JAES, AES, NY, NY, vol. 52, No. 1/2, Feb. 1, 2004, pp. 3-25.

Combined Search and Examination Report under Sections 17 and 18(3), Application No. GB1410110.9, dated Oct. 17, 2014.

* cited by examiner

TEMPERATURE MONITORING FOR LOUDSPEAKERS

This invention relates to methods and apparatus for monitoring and/or determining the temperature of a voice coil of a loudspeaker, and in particular to methods and apparatus for protecting a speaker from overheating by estimating the temperature of the voice coil of the speaker.

A number of different products include audio circuitry, such as an audio amplifier, together with one or more speakers and/or connections for driving one or more speakers of a peripheral apparatus, such as a headset. In some instances, the speaker(s) chosen will be robust enough and large enough to handle the maximum power level at which the amplifier could drive signals continuously into it, even under the worst case environmental conditions, for instance maximum supply voltage, maximum ambient temperature etc. However, having robust enough speakers is not always economical, and, for portable devices in particular, the desire is typically to make the speaker as small and light as possible. This can potentially lead to the audio drive circuitry overloading the speaker. One particular problem is thermal overload of the speaker.

A typical speaker comprises a diaphragm which is driven by a voice coil supported relative to a magnet. In typical use, an analogue audio drive signal is applied to the voice coil to drive the speaker. FIG. 1 illustrates an electrical model of a speaker voice coil. When a voltage $V_C$ is applied to the voice coil, a current $I_C$ flows. The voice coil impedance observed as defined by $V_C/I_C$ comprises some inductance $L_E$, but at low audio frequencies the ohmic resistance $R_E$ of the coil winding dominates. It will be understood that power $P_D$ is dissipated in the speaker, primarily as ohmic losses ($P_D = I_C^2 \times R_E = V_C^2/R_E$) in the voice coil which can cause heating of the voice coil. One particular problem to be avoided is overheating of the voice coil which could result in degradation in performance and/or damage to the speaker. In some particular applications therefore, there may be speaker protection circuitry for controlling the speaker operation to avoid the voice coil temperature exceeding a specified limit.

In some applications, the temperature is modelled by a predetermined plant model, based on calculated power dissipation and pre-characterised thermal impedances. However, preferably, to avoid inaccuracies or guard-banding to accommodate sample-to sample thermal impedance variations, the temperature of the coil is measured more directly.

In some applications, the temperature of the voice coil is measured by a sensor, for example, a thermistor or a diode attached to the speaker. However, this sensor adds expense and also it may not be practical to attach the sensor close enough to exactly track the temperature of the voice coil. One known alternative is to use the temperature coefficient of the metal conductor material used for the coil windings. In other words, to measure the equivalent coil resistance $R_E$ and deduce its temperature from the variation of $R_E$ over time using a known or calibrated value of $R_E$ at a reference temperature and a known value of the variation of its metal resistance with temperature, thus monitoring the temperature of the actual coil winding without an extra sensor component.

Monitoring the resistance of the voice coil requires measurement of the voltage $V_C$ across the voice coil and of the current $I_C$ flowing through the coil. Acquiring a value for the voltage is relatively easy, and often this can be deduced from the input signal applied to the driver amplifier. However, monitoring the coil current is more complex.

Embodiments of the present invention relate to estimating the temperature of a voice coil of a speaker by taking the ratio of the resistance and the inductance of the voice coil or some function thereof and comparing this to a calibration value or relationship.

According to the present invention there is provided a method of determining the temperature of a voice coil of a loudspeaker comprising:
 driving the voice coil with signal components at first and second frequencies, wherein the first frequency is higher than the second frequency, and determining first and second indications of current and voltage of the voice coil at said first and second frequencies respectively,
 determining an estimated ratio value using the first and second indications of current and voltage wherein said estimated ratio value corresponds to a ratio between a value based on the resistance of the voice coil and a value based on the inductance of the voice coil; and
 determining the temperature of the voice coil based on said estimated ratio value and at least one reference value.

The first frequency may be higher than the resistance-inductance time constant of the voice coil, in which case the first indication of current and voltage of the voice coil at the first frequency is used to determine the inductance of the voice coil. Determining the estimated ratio value may comprises: determining a first value of impedance $Z_H$ based on the first indication of current and voltage of the voice coil; and determining the inductance $L_E$ of the voice coil from the first value of impedance $Z_H$ using the relationship $L_E = Z_H/2\pi \cdot f_H$ where $f_H$ is the first frequency.

In some embodiments the second frequency may be lower than the resistance-inductance time constant of the voice coil, in which case the second indication of current and voltage of the voice coil at the second frequency may be used to determine the resistance of the voice coil. Determining the estimated ratio value may comprise: determining a second value of impedance $Z_L$ based on the second indication of current and voltage of the voice coil; and determining the resistance $R_E$ of the voice coil from the second value of impedance $Z_L$ using the relationship $R_E = Z_L$.

The second frequency may be chosen to be below or above a mechanical resonance frequency of the loudspeaker.

The method may comprise receiving at least one signal indicative of the current in the voice coil and determining said first and second indications of current and voltage of the voice coil at said first and second frequencies respectively from said at least one signal. In some embodiments the current in the voice coil is sensed using a lossless current sensing circuit. The step of determining said first and second indications of current and voltage may comprises receive at least one signal indicative of the voltage in the voice coil at the first and second frequencies.

Driving the voice coil with signal components at first and second frequencies may comprise providing a drive signal to the voice coil, the drive signal corresponding to a first audio signal; wherein said at least one signal indicative of the voltage in the voice coil at the first and second frequencies is based on said first audio signal. The first audio signal may be a digital signal and is used as said signal indicative of the voltage in the voice coil.

In some embodiments driving the voice coil with signal components at first and second frequencies may comprise sequentially driving the voice coil with pilot tone signals at the first and second frequencies. In some embodiments driving the voice coil with signal components at first and second frequencies may comprise driving the voice coil with a drive signal comprising simultaneous frequency components at the first and second frequencies.

In some embodiments driving the voice coil with signal components at first and second frequencies may comprise providing a drive signal to the voice coil, the drive signal corresponding to a first audio signal representing audio content which is not specifically generated for allowing temperature measurement; wherein said first and second frequencies correspond to frequency components expected and/or detected in said first audio signal.

Determining said first and second indications of current and voltage may comprise monitoring the voice coil current and isolating from said monitored voice coil current first and second current components at said first and second frequencies respectively. Isolating said first and second current components may comprise filtering said monitored voice coil current.

The method may further comprise generating at least one control signal for adjusting a gain applied to the audio signal path upstream of the voice coil base on the determined temperature of the voice coil.

The method may further comprise a calibration step comprising:
  receiving an indication of the temperature of the voice coil from a temperature sensor,
  driving the voice coil at the first and second frequencies and determining the first and second indications of current and voltage of the voice coil,
  determining the estimated ratio value using the first and second indications of current and voltage; and
  using the estimated ratio value and the indication of temperature to generate or modify at least one reference value.

In some embodiments the estimated ratio value may correspond to the ratio of inductance of the voice coil to the resistance of the voice coil or to the ratio of the square of the inductance of the voice coil to the square of the resistance of the voice coil.

In another aspect there is provided a system for determining the temperature of a voice coil of a loudspeaker comprising;
  at least one input for receiving at least one signal indicative of the current and voltage through the voice coil when the voice coil is being driven with signal components at first and second frequencies, the first frequency being greater than the second frequency;
  an impedance extraction module configured to receive said at least one signal indicative of the current and voltage through the voice coil and determine a first impedance of the voice coil at the first frequency and a second impedance of the voice coil at the second frequency;
  a ratio estimation module configured to determine an estimated ratio value corresponding to a ratio between a value based on the resistance of the voice coil and a value based on the inductance of the voice coil based on said first and second values; and
  a temperature estimation module configured to determine an estimated temperature of the voice coil based on the estimated ratio value and at least one reference value.

The ratio estimation module may be configured to determine a value corresponding to the inductance $L_E$ of the voice coil from the first value of impedance $Z_H$ using the relationship $L_E = Z_H / 2\pi \cdot f_H$ where $f_H$ is the first frequency and/or to determine a value corresponding to the resistance $R_E$ of the voice coil from the second value of impedance $Z_L$ using the relationship $R_E = Z_L$.

The system may further comprise a signal processing block disposed in a signal path for audio signals for driving the loudspeaker. The signal processing block may be operable to generate an audio signal for driving the loudspeaker comprising said first and second frequencies. The signal processing block may be configured to generate an audio signal comprising sequential first and second pilot tones at said first and second frequencies respectively and/or an audio signal comprising simultaneous frequency components at the first and second frequencies.

The first frequency may be above the resistance-inductance time constant for the voice coil and/or the second frequency may be below the resistance-inductance time constant for the voice coil.

The impedance extraction module may comprise at least one filter for filtering the at least one signal indicative of the current and voltage through the voice coil to isolate current and/or voltage components at the first and second frequencies.

The system may further comprise current sensing circuitry for sensing the current through the voice coil and providing the signal indicative of the current through the voice coil to the impedance extraction module. The current sensing circuitry may comprise lossless sensing circuitry.

The system may further comprise a control module for generating at least one control signal depending on the determined temperature of the voice coil. At least one control signal may comprise a gain control signal for modulating a gain applied to an audio signal in a signal path upstream of the loudspeaker.

In some embodiment the signal processing block may impart a gain on the input signal to the drive signal.

At least one of the impedance extraction module and the ratio estimation module may comprise a processor configured to execute code stored in a memory. The system may further comprise a loudspeaker.

The system may be implement in an electronic apparatus, which may be at least one of: a portable device; a battery power device; a computing device; a communications device; a gaming device; a mobile telephone; a personal media player; a laptop, tablet or notebook computing device.

Aspects of the invention also relate to software code stored on a non-transitory storage medium which, when run on a suitable processor, performs any of methods discussed above or provides the system in any of the variants discussed above. The software code may be stored in memory of an electronic device.

In a further aspect there is provided an electronic device comprising memory containing software code and a suitable processor for performing any of the methods discussed above.

In a further aspect there is provided a system for determining the temperature of a voice coil of a loudspeaker comprising a processor and a memory, said memory containing instructions executable by said processor whereby said system is operative to:
  receive first and second indications of current and voltage of the voice coil when the voice coil is being driven with signal components at first and second frequencies respectively, the first frequency being greater than the second frequency;
  determine an estimated ratio value using first and second indications of current and voltage wherein said estimated ratio value corresponds to a ratio between a value based on the resistance of the voice coil and a value based on the inductance of the voice coil; and determine the temperature of the voice coil based on said estimated ratio value and at least one reference value.

In a yet further aspect there is provided an apparatus for monitoring the temperature of a voice coil of a loudspeaker comprising:
- a first module for determining a first value corresponding to the ratio of a value based on the resistance of the voice coil and a value based on the inductance of the voice coil; and
- a second module for determining the temperature of the voice coil based the first value and at least one reference value.

The first module may be configured to determine a value of the resistance of the voice coil based on the impedance of the voice coil to a driving signal at a frequency below the resistance-inductance time constant of the voice coil. The first module may be configured to determine a value of the inductance of the voice coil based on the impedance of the voice coil to a driving signal at a frequency above the resistance-inductance time constant of the voice coil.

In a further aspect there is provided an apparatus for determining the temperature of a voice coil of a loudspeaker comprising:
- a first module for determining the impedance of the voice coil at a first driving frequency and a second, different, driving frequency; and
- a second module for determining the temperature of the voice coil based on the determined impedances at said first and second driving frequencies.

A further aspect relates to a method for determining the temperature of a voice coil of a loudspeaker comprising: estimating the voice coil temperature based on a value dependent on a ratio of the estimated inductance and resistance, said ratio being derived from coil current and voltage components at at least two signal frequencies.

For a better understanding of the present invention, and to show how it may be put into effect, reference will now be made, by way of example, to the following drawings, in which.

DESCRIPTION

Embodiments of the present invention relate to loudspeaker temperature estimation systems which determine an estimated ratio value corresponding to the ratio of a value based on the resistance of the voice coil and a value based on the inductance of the voice coil of the speaker and which use this ratio value to determine the voice coil temperature, for instance by using a predetermined relationship or calibration value.

Figure 1:
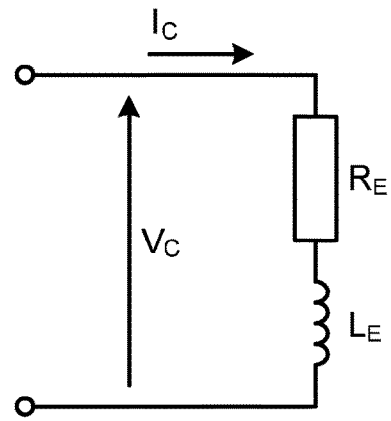
FIG. 1 illustrates an electrical model of a speaker voice coil.
Figure 2:
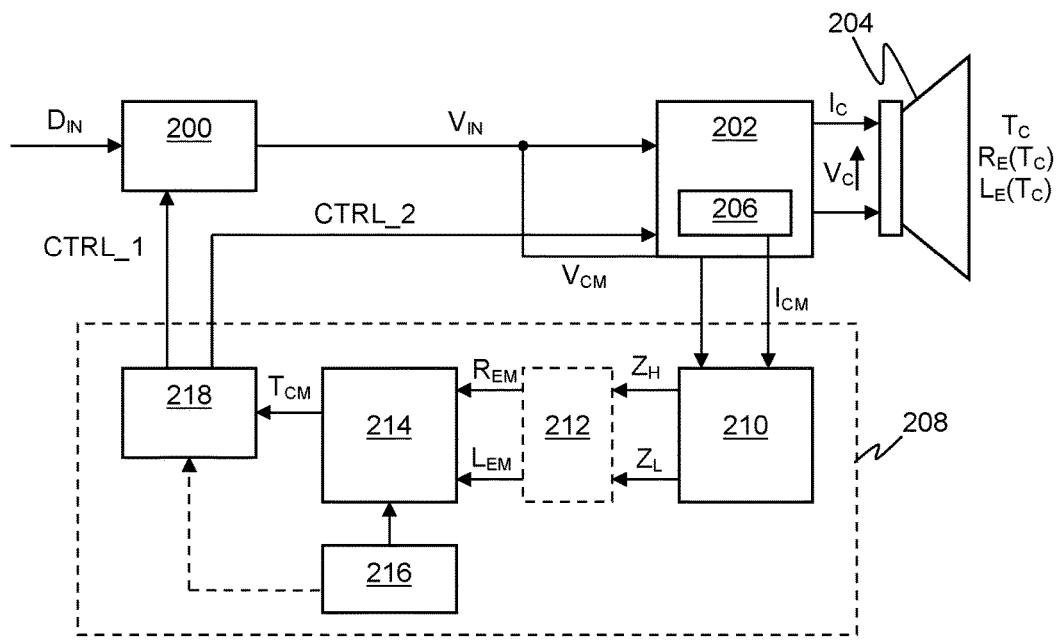
FIG. 2 illustrates an amplifier system according to an embodiment of the invention which includes temperature estimation functionality.

FIG. 2 illustrates amplifier circuitry according to an embodiment of the invention which includes temperature estimation functionality. Signal processing block 200 receives an input signal $D_{IN}$ at an input terminal and processes it, providing an output signal to the output driver amplifier 202, which drives the speaker 204. In this example the input signal $D_{IN}$ is a digital signal but in other embodiments it may be an analogue signal. The output driver amplifier may comprise any type of amplifier stage such as a Class D, Class AB, Class G or Class H power amplifier stage and associated modulation circuitry.

The input terminal may be a circuit contact such as a bond pad or the like for connecting to another circuit, or could simply be a node of a signal path which represents the input to the signal processing block 200. For the avoidance of doubt, the phrase "input terminal" as used herein includes an input node and no particular physical characteristics are implied by the word "terminal".

The signal processing block 200 may comprise a multiplier or digital gain stage, digital filtering or other digital processing and a digital-analogue convertor. In converting from a digital signal to an analogue signal the signal processing block 200 may impart an overall gain from the input signal $D_{IN}$ to the drive signal $V_{IN}$ input into the output driver amplifier 202.

It should be noted that the digital processing block 200 may comprise at least some custom-designed logic circuitry and/or may comprise a general purpose processor running appropriate code.

The speaker 204 may be grounded externally and driven from a signal output terminal, or both speaker terminals may be connected to the signal processing chain, for example, where both terminals are driven in from a full-bridge output stage or where the ground return current is passed through the driver circuitry as illustrated.

The output driver amplifier 202 comprises current sensing circuitry 206 for sensing the current $I_C$ flowing through the voice coil of the speaker. This current $I_C$ may, for example, be sensed in a power supply or ground return lead, monitored in series with the load, or monitored by sensing current through or voltage across the amplifier output elements. An example of a possible current sensing circuitry 206 is described below in reference to FIG. 3.

Figure 3:
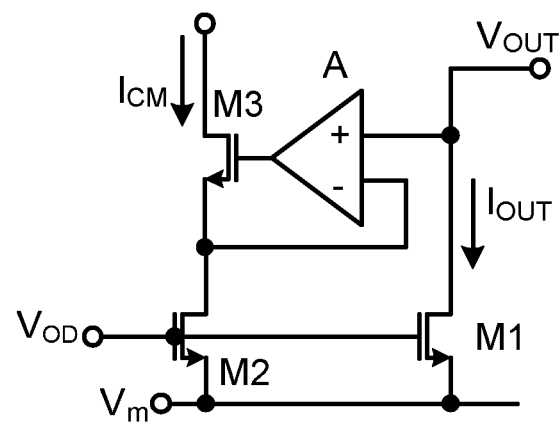
FIG. 3 illustrates an example of an output stage with current sensing circuitry.

FIG. 3 illustrates one example of current sensing circuitry that may be used in an embodiment of the invention. Such current sensing circuitry does not involve a sense resistor, with an associated voltage drop and power dissipation, and thus is referred to as lossless current sensing circuitry. A drive signal $V_{OD}$, which is indicative of the voltage being used to drive the voice coil, is applied to the gate node of a first transistor M1 which is, in this case an NMOS. This then generates a drain current $I_{OUT}$ through the transistor M1 which is passed through a terminal attached to a load impedance to generate an output voltage $V_{OUT}$. The source node of this first transistor M1 is connected to a reference voltage $V_m$ which may be ground or may be negative. A second transistor, M2, which in this case is an NMOS, is connected with its gate and source in parallel with those of the first transistor M1. The drain voltage of the second transistor is maintained at the same voltage $V_{OUT}$ by the amplifier A and pass circuitry M3. Therefore, M2 delivers the same drain current $I_{CM}$, which is a replica of $I_{OUT}$, through the transistor M3. This current, $I_{CM}$, may then be passed on to other circuitry for further processing. In practical circuits, M2 may be scaled in width or length compared to M1, so $I_{CM}$ may be a scaled replica of $I_{OUT}$.

In some implementations the transistors M1 and M2 may form at least part of an output stage of the output driver amplifier 202 and thus the drive signal may be the input analogue drive signal $V_{IN}$ or a signal derived from $V_{IN}$. In other implementations however the current sense circuitry illustrated in FIG. 3 may be separate to the output stage of the output driver amplifier 202 and configured to receive the drive signal $V_{OD}$ (which could be derived from the drive signal $V_{IN}$ or from the signal output by the output stage) and to output the sensed current $I_{CM}$. It should be noted that the circuitry shown in FIG. 3 could be part of a Class D amplifier where the input signal is a digital two-level signal switching the transistor M1 on and off.

In some known implementations of loudspeaker thermal protection, current sensing has been used to sense the voice coil current and used, together with an indication of the voice coil drive voltage, to determine the resistance of the voice coil. The resistance varies with temperature and thus the determined resistance value is compared with a reference value to determine the present temperature.

It has been appreciated however there are multiple possible error sources in a real circuit of the type shown in FIG. 3 which mean that such a circuit is not suitable for accurate temperature sensing in this way. For instance, for a power device, the ohmic voltage drops across the metal interconnections connecting various parts of the output power device may be significant. Consequently these voltage drops will cause differences in the voltages applied locally access the actual active channel of the transistor (i.e. the local source drain voltage), the voltages applied between various parts of the output transistor, and the voltages between the transistors M1 and M2.

In some embodiments, the transistor M2 will be quite small and so there may be variations in the effective width or length or threshold voltage or conductivity of the transistor M2 relative to the transistor M1 due to manufacturing inaccuracies. Differences in overlying metal patterns or in the mechanical stress of the local substrate may also induce unpredictable mismatches in the electrical characteristics of M1 and M2. The amplifier A may have an input offset voltage which may result in a mismatch $\Delta V_{DS}$ in the drain-source voltages of M1 and M2, leading to a component of the error in sensed current which may scale with current.

The overall error in the sensed current relative to the actual current may be assumed to mainly comprise a fixed offset component and a scaling error.

Figure 4:
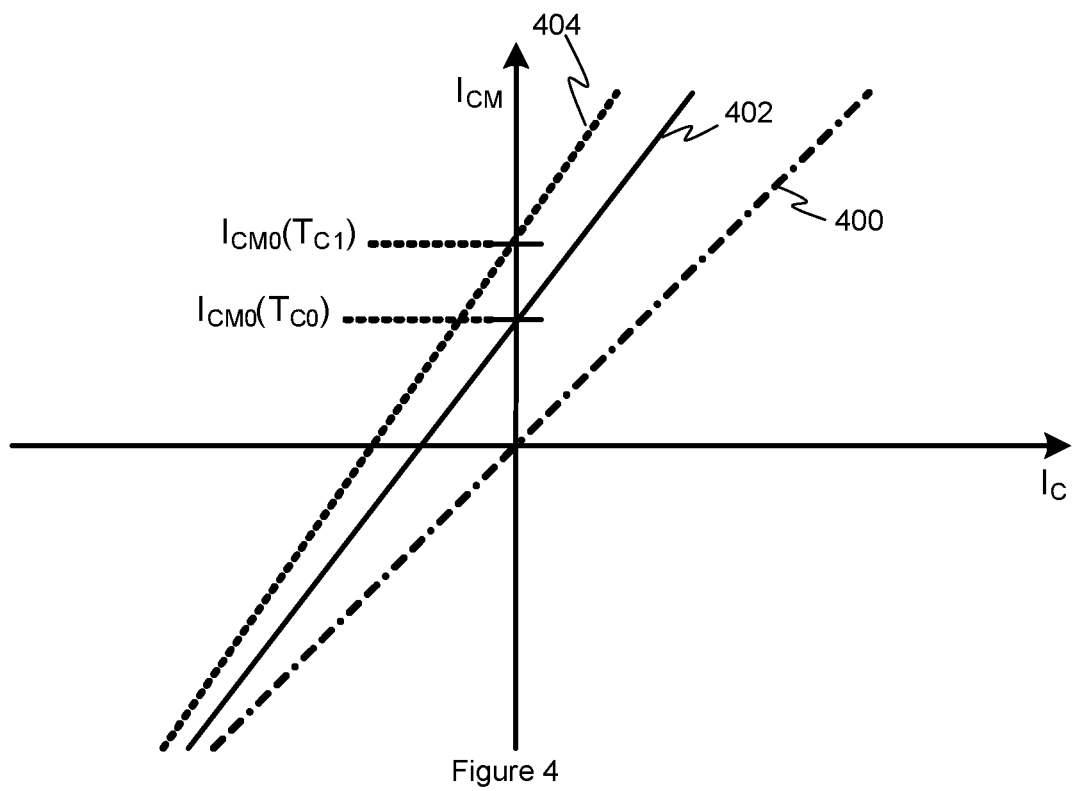
FIG. 4 illustrates a plot of how the sensed current may exhibit an error compared to the actual voice coil current.

FIG. 4 shows a graph of the sense current $I_{CM}$ versus the actual coil current $I_C$ as may be measured by current sensing circuitry of the type illustrated in FIG. 3. All or some of the possible sources of error described above are likely to cause an error in the overall sensed current $I_{CM}$ versus the actual coil current $I_C$. The nominal characteristic which would theoretically arise, without any of the above described error sources, is shown by the plot 400. This nominal characteristic can be represented by:

$$I_{CM}=F_{CM0} \cdot I_C, \quad \text{(Equation 1)}$$

where $F_{CM0}$ is a scaling factor due to the effective gain of the sensing circuit.

However, the actual characteristic at a particular temperature $T_0$ may be represented by:

$$I_{CM}=F_{CM}(T_0) \cdot I_C+I_{CM0}(T_0), \quad \text{(Equation 2)}$$

as illustrated by example in the plot 402. In other words there may be an offset current component $I_{CM0}$ and the scaling factor $F_{CM}$ may vary from nominal.

Furthermore, the errors produced may vary with temperature and, hence, a different characteristic:

$$I_{CM}=F_{CM}(T_1) \cdot I_C+I_{CM0}(T_1), \quad \text{(Equation 3)}$$

may be produced at a different temperature $T_1$ as illustrated by plot 404. It should also be noted that, for some on-chip error sources, the relevant temperature could be the local circuit temperature which may vary independently of the coil temperature.

These sources of error in the sensed current will result in corresponding errors in the determined voice coil resistance and thus could lead to errors in the determined temperature of the voice coil. Such errors can be significant. For instance in some implementations an error in the sensed current of the order of 5% could lead to an error in temperature estimate of the order of 10° C.

In order to overcome the error in the characteristics of the sensed voice coil current produced at different temperatures described in reference to FIGS. 3 and 4, in embodiments of the invention the voice coil current $I_C$ and voltage $V_C$ are estimated with the voice coil being driven at two different frequencies, $f_H$ and $f_L$, in order to give two values of the impedance of the voice coil, i.e. $Z_H$ and $Z_L$. These two impedance values can then be used to estimate a value corresponding to an estimated ratio based on the inductance and resistance of the voice coil. In some embodiments the ratio $L_{EM}/R_{EM}$ of the inductance to the resistance of the voice coil may be determined. Determining the impedance of the voice coil at two different frequencies of driving signal, and using these impedances to determine an estimated ratio $L_{EM}/R_{EM}$ between the inductance and resistance of the voice coil, provides a method temperature estimation that at least mitigates the problems with errors in the sensed current signal discussed above.

First, the use of AC waveforms may substantially eliminate the offset term $I_{CM0}$, assuming a linear characteristic between the sensed current $I_{CM}$ and the actual current $I_C$ as shown in FIG. 4. Even if the relationship between sensed and actual current exhibits some non-linearity the effect of any offset may be reduced.

Second, by using a ratio between a value based on the resistance of the voice coil and a value based on the inductance of the voice coil, any multiplicative error in $F_{CM}/F_{CM0}$ may be substantially cancelled out, provided that the measurements are taken close enough together not to allow any significant intervening temperature rises. As will be described later these measurements may be acquired sequentially over periods in which no significant temperature rise may occur or, in some embodiments, may even be taken simultaneously. The ratio value determined may correspond to the ratio of inductance to resistance (or vice versa) but in some embodiments the ratio may correspond to another relationship between inductance and resistance, for instance the ratio of the square of the inductance of the voice coil to the square of the resistance.

Although the actual resistance $R_E$ and actual inductance $L_E$ of the voice coil may each have different temperature coefficients to one another, a ratio based on these values, e.g. $L_E/R_E$, will have a net temperature coefficient, and so the temperature of the voice coil may be estimated by, for instance, comparing the estimated ratio of $L_E/R_E$ to at least one reference value, which may for instance correspond to the ratio $L_E/R_E$ at a given reference temperature, and using a value for the net temperature coefficient to deduce the change in temperature relative to the reference temperature.

The speaker protection control module 208 may thus receive an indication of the sensed voice coil current $I_{CM}$ and voice coil voltage $V_{CM}$ and determine a first and second indication of the voltage and current of the voice coil corresponding to the first and second frequencies respectively. The ratio based on voice coil resistance and inductance is determined using these first and second indications of the current and voltage that correspond to the first and second frequencies. In some embodiments the speaker protection control module 208 may use said first and second indications of current and voltage of the voice coil at the first and second frequencies to determine a first value of impedance $Z_H$ corresponding to the voice coil impedance at a first driving frequency and a second value of impedance $Z_L$ corresponding to the voice coil impedance at a second driving frequency. From these first and second impedance values the speaker protection control module 208 may derive an estimated resistance $R_{EM}$ and estimated inductance $L_{EM}$ of the voice coil from which an estimated ratio value of resistance to inductance can be determined. These estimates may then be used to derive an estimate of the voice coil temperature $T_{CM}$.

In some embodiments the audio signal $V_{IN}$ output from the signal processing block 200 may be used as an indication or estimate of the voice coil voltage $V_C$. It will be appreciated, however, that another measure of $V_C$ could be used and in some instances, where the received digital audio signal $D_{IN}$ is used to provide signal components at the two frequencies (as will be described in more detail later) the digital audio signal could be used as the indication of the coil voltage, with appropriate allowance for any fixed or variable conversion gain from $D_{IN}$ to $V_{IN}$. The output driver amplifier 202 may provide a fixed or adjustable gain, $A_V$, in which case the gain $A_V$ may be taken into account when determining the estimated voice coil drive voltage from $V_{IN}$.

The speaker protection control module 208 receives these indicative signals $I_{CM}$ and $V_{CM}$ and derives an appropriate gain control signal to vary the gain in the audio signal path prior to driving the loudspeaker. For instance a first control signal CTRL_1 may be generated to control the gain applied by the signal processing block 200. Additionally or alternatively a second control signal CTRL_2 may be supplied to the output driver amplifier 202 in order to control the gain $A_V$ applied to the signal $V_{IN}$. It will be appreciated that in practice a suitable gain could be applied any suitable point or points along the signal path upstream of the speaker. When the estimated voltage and current signals $I_{CM}$ and $V_{CM}$ suggest that there is a danger of thermally overloading the speaker 204 the gain applied to the input signal $D_{IN}$ and/or the gain $A_V$ applied to the drive signal $V_{IN}$ is modulated by controlling the signals CTRL_1 and/or CTRL_2 such that it reduces the signal applied to the speaker 204. In particular, these control signals may alter the digital gain applied to the signal $D_{IN}$ and the gain applied to the drive signal $V_{IN}$ so as to modulate the signal applied to the speaker to a safe level.

In one embodiment the speaker protection module 208 comprises an impedance extraction block 210 which receives the estimated voltage and current signals $I_{CM}$ and $V_{CM}$. In some embodiments the impedance estimation block may receive signals corresponding to the voice coil current and voltage at the first frequency, i.e. the first indication of voice coil current and voltage, and separate signals corresponding to the voice coil current and voltage at the second frequency, i.e. the second indication. In some embodiments however as will be explained below the impedance extraction block may have to process the current and/or voltage signals to determine the first indication of the voltage and current of the voice coil that corresponds to the voice coil being driven at the first frequency and also the second indication of the voltage and current of the voice coil that corresponds to the voice coil being driven at the second frequency. From the indications impedance extraction block 210 derives first and second impedances of the voice coil at the first and second frequencies $f_H$ and $f_L$ respectively.

The impedance values may be passed to a resistance and inductance estimation block 212 which may determine an estimate $R_{EM}$ of the resistance, $R_E$, of the voice coil, and the estimate, $L_{EM}$ of the inductance, $L_E$, of the voice coil. The estimates, $R_{EM}$ and $L_{EM}$ may then passed on to a temperature estimation block 214 which derives an estimated ratio value based on the estimated resistance and inductance, e.g. the ratio $R_{EM}/L_{EM}$, and uses this ratio value to provide an estimate $T_{CM}$ of the temperature $T_C$ of the voice coil. The temperature estimation block may determine the temperature based on the estimated ratio value and at least one reference value, e.g. corresponding to the ratio of resistance to inductance at a known temperature. The temperature estimation block may therefore comprise or be in communication with a memory 216 storing the at least one reference value and/or a transfer characteristic between estimated ratio value and temperature. The estimate of the temperature $T_C$ of the voice coil may then be provided to a control block 218 which may generate appropriate gain control signals CTRL_1 and/or CTRL_2.

Note in some embodiments the resistance and inductance estimation block 212 may determine the estimated ratio value, which may be provided to the temperature estimation block 214. Thus either of blocks 212 or 214 may determine the estimated ratio value. In some embodiments the individual values of resistance and inductance may not be separately determined as distinct values and the ratio may be determined directly based on the impedance values. In some instances the resistance and inductance estimation block 212 may be omitted and the temperature estimation block may act directly on the impedance values to determine the estimated ratio value.

Likewise it will of course also be appreciated that at least some of the functions of the impedance extraction block 210 may be combined with at least some of the resistance and inductance estimation block 212 and/or temperature an estimation block 214 and in such a case the value of the impedance of the voice coil at the first and second frequencies may not be output anywhere as distinct values. Thus the estimated ratio value may be determined based on the first and second indications of current and voltage of the voice coil at the first and second frequencies.

It will additionally or alternatively be appreciated that the control block 218 may be implemented elsewhere, for instance in circuitry upstream in the audio signal path to the loudspeaker, and thus the module 208 may just determine an estimate of voice coil temperature which may be supplied as a temperature signal.

Note that as used herein the term 'block' shall be used to refer to a functional unit which may be implemented at least partly by dedicated hardware components such as custom defined circuitry and/or at least partly be implemented by one or more software processors or appropriate code running on a suitable general purpose processor or the like. It should also be noted that any circuitry components forming part of one block may be shared with another block and/or the same processor may implement multiple blocks. As used in this specification the term module shall also be interpreted in the same way as the term block.

In some embodiments of the present invention the ratio value, e.g. $R_{EM}/L_{EM}$, may be determined by driving the voice coil of the speaker with drive signals having two different signal frequency components and determining first and second indications of the voice coil current and voltage for said different frequency components. The first and second indications of sensed voice coil current $I_{CM}$ and voltage $V_{CM}$ may be used to determine the impedance of the voice coil at the two different frequencies, from which the resistance $R_{EM}$ and inductance $L_{EM}$ may be determined, as will be described in more detail below. In some embodiments the relevant drive signal frequencies may be supplied by using sequentially first and second pilot tones at first and second frequencies respectively. It will of course be appreciated that the pilot tones may be supplied in either order and there could be a short gap between applying a pilot tone at one frequency and then a pilot tone at the other frequency. As noted above however the two frequencies should be applied over a time period which is not so long that any significant temperature rise would be likely to occur. In some embodiments a single pilot tone signal may be used which comprises frequency components at both of said first and second frequencies respectively, i.e. the first and second frequency driving signals are applied to the voice coil simultaneously. In some embodiments the pilot tone(s) may be defined upstream of the circuitry illustrated in FIG. 2 and supplied as input signal $D_{IN}$. Thus the digital audio signal $D_{IN}$ received may, at least periodically, comprise the pilot tones at the first and second frequencies which can be used to drive the loudspeaker. In some embodiments however the pilot tones may be generated and injected into the signal path locally. For example the signal processing block 200 may generate suitable pilot tones signals as an analogue audio signal $V_{IN}$. Additionally or alternatively a pilot tone signal at the frequency or frequencies of interest may be added to the input signal $D_{IN}$ received.

In some embodiments the pilot tone signals may be applied continuously or repeatedly during operation of the loudspeaker to allow continuous or frequent monitoring of the temperature of the voice coil. In such a case the pilot tones may advantageously be selected so as to not substantially interfere with the intended operation of the loudspeaker.

For example when the loudspeaker is being used to generate audio for a user to listen to the first pilot tone may be selected to have a first, relatively high frequency that is outside the normal audio band. For example the pilot tone could correspond to a first frequency which is greater than around 20 kHz, for example around 21-25 kHz or greater. Such high frequencies are not generally audible and thus such a high frequency component in the loudspeaker output would not be noticeable by a user. Such a relatively high frequency pilot tone could therefore be used regularly or continuously without substantially impacting on the user experience.

The second pilot tone may be selected to have a second, relatively low frequency which is not well reproduced by the loudspeaker. As will be appreciated by one skilled in the art many loudspeakers have a weak low frequency response, i.e. a weak bass response. In other words the loudspeaker may exhibit a high mechanical impedance at low frequencies. Whilst the electromechanical response of the loudspeaker to such low frequency driving signals is weak this is mainly due to the mechanical response/coupling and this does not substantially affect the electrical response of the voice coil to low frequency driving signals. Thus a continuous or frequency low frequency driving signal, say of the order of a few Hz or a few tens of Hz or so, may be used to drive the voice coil. The electrical response will be sufficient to allow the resistance of the voice coil to be determined but the acoustic response of the loudspeaker at this frequency will be weak. Such a driving signal component may therefore result in substantially no noticeable difference in the loudspeaker acoustical output.

In some embodiments it may additionally or alternatively be possible to use the input signal $D_{IN}$ itself to provide the signal components at different frequencies without the need for specific pilot tones. The input signal $D_{IN}$ will represent an audio signal for audio content which is not specifically generated for allowing temperature measurement. Such audio content may for example be at least part of the audio track of a media file, such as a music track or video file for example. The audio content could be audio voice data for a voice or video call and/or the audio content could be an audio alert connected with operation of the host device, e.g. a beep based on a button press or the like. Such audio content will typically contain multiple frequency components and thus the frequency response of the voice coil during normal operation with a given audio signal may be monitored to detect the impedance of the voice coil at both first and second frequencies. The first and second frequencies may be predefined based on the expected frequency components of typical audio signals. Thus the sensed voice coil current and/or voltage could be filtered at two or more predefined frequencies to detect any instances when the voice coil is being driven at said first and second frequencies within a short period of time, in other words any signals of opportunity within the audio signal are used.

To avoid having to wait until signals of exactly the correct nominal frequencies to occur, in some embodiments the spectral content of the input audio signal could additionally or alternatively be analysed to determine the occurrence of adequately strong frequency components within suitably predetermined bands of frequency and extract the impedances at a high and a low signal frequency autonomously chosen on-the-fly, if necessary compensating for any current deviation of the actual component frequencies from the nominal values.

In some embodiments the estimated voice coil current and voltage may also be used for other purposes, for example for estimating the mechanical displacement of the voice coil and limiting any such excursion to a safe range. In such a case the voltage and current may be analysed at more than two frequencies, for example to estimate the mechanical resonance. The calculations of inductance, resistance or their ratio may run concurrently or be combined with other calculations. In some cases the calculation may comprise adapting the coefficients of an electromechanical loudspeaker plant model comprising many parameters in addition to the coil resistance and inductance. However the values of resistance and inductance will still be primarily based on analysing current and voltage signals at at least a respective low frequency and a respective high frequency, possibly with corrections as described below for any interaction or corrections for other effects affecting the electrical impedance e.g. a mechanical resonance.

Regardless of the means of providing the estimated coil resistance and inductance, embodiments of the invention will provide an estimate of the coil temperature based on a value dependent on a ratio of the estimated inductance and resistance, as derived from coil current and voltage components at at least two signal frequencies.

The control block 218 may compare the temperature estimate $T_{CM}$ to a predetermined threshold temperature, which may for example be stored in the memory 216, possibly applying some hysteresis. The control signals CTRL_1 and/or CTRL_2 may then be derived based on whether or not the temperature estimate is above or below the threshold temperature.

Figure 5:
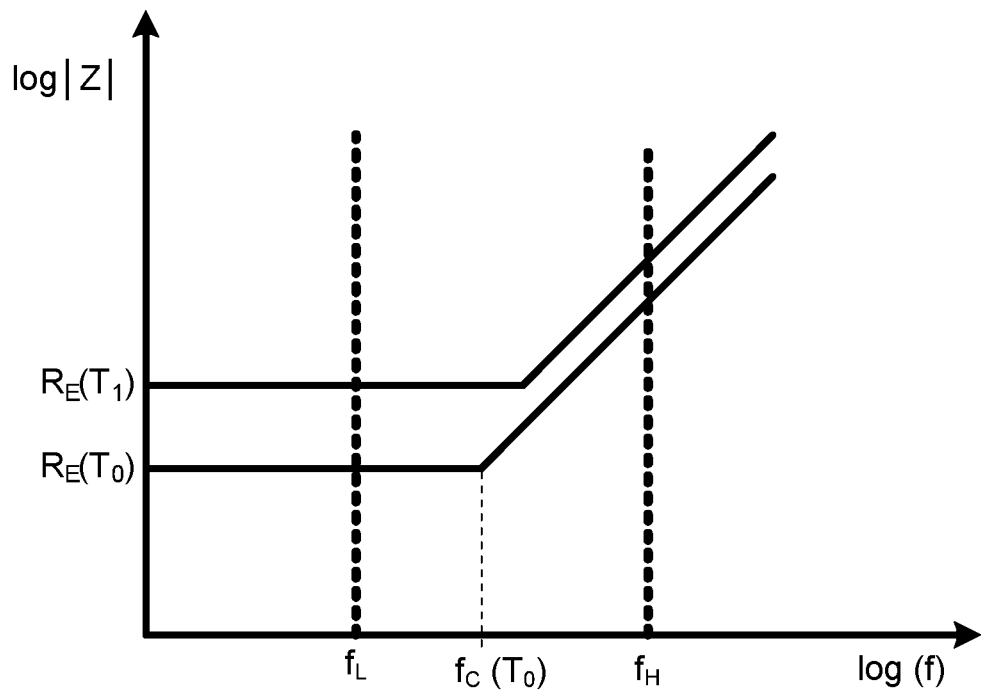
FIG. 5 illustrates a graph of the log magnitude of the coil impedance versus the log of the input signal frequency.

By an appropriate choice of frequency components $f_H$ and $f_L$ it is possible to determine the impedance of the voice coil at the two separate frequencies and hence estimate the voice coil resistance and inductance. In one embodiment the frequencies $f_H$ and $f_L$ may be chosen to be respectively above and below the $L_E/R_E$ time constant of the speaker, i.e. the corner frequency of the response of the voice coil, for the expected temperature range and allowing for manufacturing tolerances. In other words the low frequency may be below the lowest expected $L_E R_E$ time constant within the expected temperature range and the high frequency may be above the highest expected time constant. FIG. 5 shows a graph of the log magnitude of the coil impedance versus the log of the input signal frequency.

As shown in FIG. 5, in some embodiments of the invention the frequencies $f_H$ and $f_L$ may be chosen to be above and below a corner frequency corresponding to the $L_E/R_E$ time constant of the voice coil, i.e. the corner frequency shown by $F_C$ in FIG. 5 (or the expected range in which the corner frequency may fall). As will be understood by one skilled in the art, well below the corner frequency the resistance of the voice coil will dominate and the impedance of the voice coil will be substantially equal to the resistance. With driving frequencies well above the corner frequency the inductance will dominate that the effective impedance will be substantially equal to $2\pi f_H L_{EM}$. If the frequencies are thus selected accordingly, it may be possible to estimate the resistance from the effective impedance determined at the lower frequency by taking $Z_L$ as being equal to $R_{EM}$. It may additionally be possible to estimate the inductance based on the effective impedance at the higher frequency by taking $Z_H$ as being equal to $2\pi f_H L_{EM}$. These estimations mean that the determination of the ratio $L_{EM}/R_{EM}$ between the inductance and resistance of the voice coil is very simple and straightforward.

Figure 6:
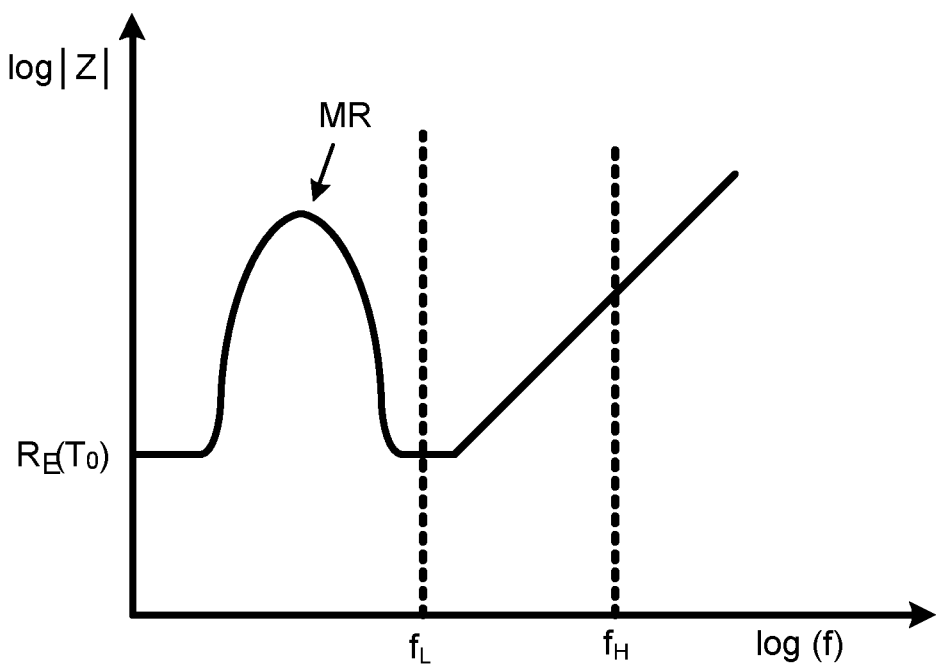
FIG. 6 illustrates a graph of the log of the coil impedance versus the log of the input signal frequency which illustrates a potential mechanical resonance of the speaker.
Figure 8:
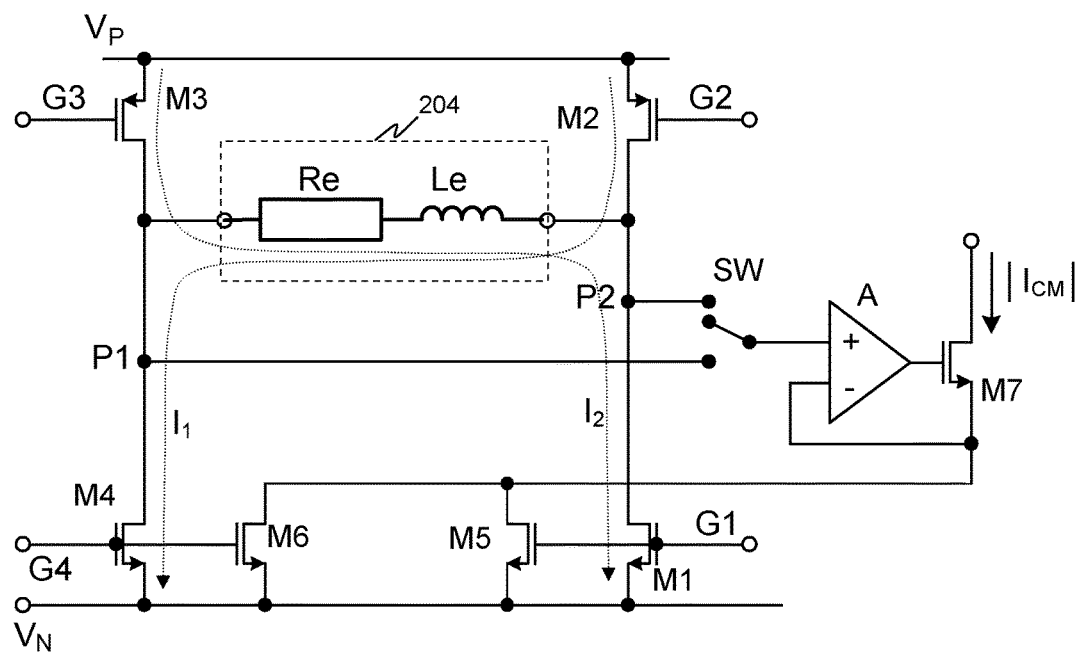
FIG. 8 illustrates a class D output stage with current sensing circuitry in accordance with an aspect of the present invention.

It should be noted that some speakers have a lower-frequency mechanical resonance, usually in the range of 100-1000 Hz. This resonance appears in the impedance vs. frequency characteristic. FIG. 6 shows a graph of the log of the coil impedance versus the log of the input signal frequency which illustrates a potential mechanical resonance of the speaker. In FIG. 8 this resonance is represented by the peak MR. It will be appreciated that the resonance may take other forms. As the speaker is used over time this resonance may change. Therefore, in order to provide an accurate representation of the resistance of the speaker, the lower frequency input signal, $f_L$ should preferably by selected either below or above this mechanical resonance peak, with allowance for an anticipated variation over time.

It will be appreciated that if $f_L$ is set to be relatively low, for example below the mechanical resonance peak MR, then the measurement time required may be relatively long. In some instances this could lead to measurements being impaired or altered by a.c. coupling in the signal path either before or after the output driver amplifier.

However, if $f_L$ is set to be relatively high, for example above the mechanical resonance peak MR, then the effect of $L_E$ may no longer be negligible. In this case the relationship between the measured impedance and the resistance of the voice coil may be more complex. However it is still possible to determine either or both the resistance and the inductance of the voice coil and/or the ratio of resistance to inductance by using the effective impedance determined at the two frequencies, for example by the use of the following relationships:

$$R_E = \sqrt{\frac{(f_H^2 |Z_L|^2 - f_L^2 |Z_H|^2)}{(f_H^2 - f_L^2)}} \quad \text{(Equation 4)}$$

and $$L_E = \sqrt{\frac{(|Z_L|^2 - R_E^2)}{(4\pi^2 f_L^2)}} . \quad \text{(Equation 5)}$$

Therefore, any two significantly different frequencies could be implemented as $f_H$ and $f_L$ whilst still allowing the ratio $L_E/R_E$ to be determined.

The higher frequency, $f_H$, of the input signal may typically be limited by the output driver amplifier, i.e. by the input range of the amplifier and the range of frequencies it can practically amplify. Furthermore, stray capacitances and the self-capacitance of the voice coil winding may start to take effect at higher frequencies. Therefore, it may be necessary to have $f_H$ at a frequency at which the effect of the resistance $R_E$ is still significant. Again, however the resistance and/or the inductance and/or the ratio of the resistance and the inductance of the voice coil can still be obtained using, for example, the relationships set out in equations 4 and 5.

As noted previously the estimated ratio value that is determined may correspond to the ratio of inductance to resistance of the voice coil. However it possible to use other relationships to determine a suitable value, i.e. to determine a ratio between a function of the voice coil inductance and a function of the voice coil resistance, i.e. $f_1(R_E)/f_2(L_E)$. In particular it can be seen from equations 4 and 5 that the value of inductance and resistance are both determined as the square root of a function determined from the first and second driving frequencies and the measured impedances. Taking a square root can be relatively computationally expensive or complex. In some embodiments therefore it may be preferred to determine a ratio value corresponding to a ratio of the square of the inductance of the voice coil to the square of the resistance of the voice coil. Using such an estimated ratio value would avoid the need to determine a square root. An estimate ratio value based on the square of the inductance and square of the resistance would likely have a different net temperature coefficient to the ratio of the inductance to the resistance but the reference value(s) and transfer characteristic could be chosen accordingly.

To maintain the cancellation of scale errors, the functions $f_1(R_E)$ and $f_2(L_E)$ need to be chosen to be such that their calculated ratio is independent of a common scaling factor applied to both $R_E$ and $L_E$. The calculation may actually be performed equivalently as a function $f_3(R_E/L_E)$.

As mentioned above in order to determine the temperature of the voice coil the determined ratio value may be compared to at least one reference value. The reference value may for instance correspond to a known value of the ratio of resistance to inductance at a known temperature. The comparison may be performed in many different ways. For instance based on the at least one reference value and a value of the temperature co-efficient (for the ratio of the resistance to inductance) the temperature estimation block 214 may implement a transfer characteristic between the estimated ratio of $L_E/R_E$ and the present temperature. The temperature estimation block 214 may implement such a transfer characteristic as a software process and/or via appropriate custom circuitry. The value of the relevant temperature coefficient could be predetermined for the voice coil, for example based on knowledge of the construction of the voice coil and/or a calibration process such as a factory calibration step, and stored in some suitable memory, such as the memory 216, or hardwired into a custom circuit. In some embodiments the estimated ratio may be input to a look-up table or the like to determine the present temperature, the look-up table being populated based on the transfer characteristic and/or through a calibration step.

At least one reference value may be set in a calibration step. The speaker protection circuitry may be calibrated for example by driving the voice coil using two or more test tone frequencies, e.g. the pilot tone frequencies, whilst the voice coil is at a known temperature and determining the impedance response to calculate a value of the $L_E/R_E$ ratio at this known temperature. Such a calibration step could be performed as part of a factory calibration step and/or in some embodiments where the host device includes a temperature sensor that measures ambient temperature it may be possible at start-up of the amplifier circuitry, i.e. before significant operation of the voice coil, to perform a calibration step taking the ambient temperature as the temperature of the voice coil.

Figure 7:
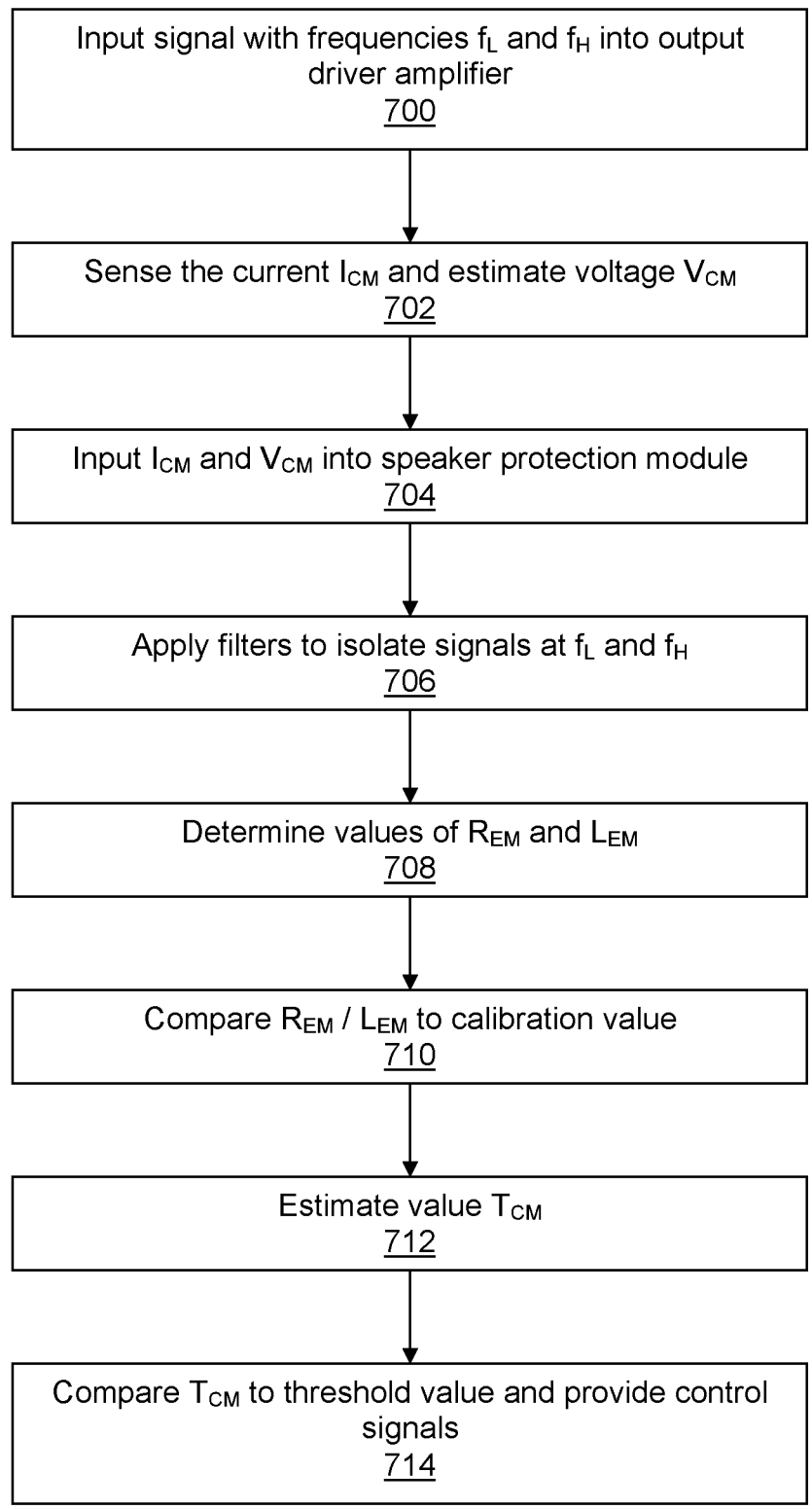
FIG. 7 illustrates a flow chart for a method carried out in the amplifier system according to an aspect of the present invention.

FIG. 7 shows a flow chart for a method carried out in the amplifier system according to an aspect of the present invention.

In step 700 the drive signal $V_{IN}$ is input into the output driver amplifier 202, the drive signal having component frequencies $f_H$ and $f_L$. In some embodiments the component frequencies $f_H$ and $f_L$ are present in the digital signal $D_{IN}$. In other embodiments the frequencies $f_L$ and $f_H$ are injected by the signal processing block 200 and output in the drive signal $V_{IN}$.

In step 702 the current $I_{CM}$ is sensed by the current sensing circuitry 206 and the estimated voltage $V_{CM}$ is derived from the input signal $D_{IN}$ or the drive signal $V_{IN}$.

The current $I_{CM}$ and voltage $V_{CM}$ are then supplied to the speaker protection control module 208 in step 704.

Optionally in step 706 the sensed current and/or estimated voice coil voltage may be filtered by one or more filters to isolate the components corresponding to frequencies $f_L$ and $f_H$ so that the impedance extraction block 208 can determine the values of the first and second impedances $Z_H$ and $Z_L$. It will be appreciated of course that if filtering is required that these filters could be applied at different points, for instance the sensed current may be filtered prior to being supplied to the speaker protection control module 208.

In step 708, the resistance and inductance estimation block generates estimates of the resistance and inductance of the voice coil, $R_{EM}$ and $L_{EM}$ (or possibly estimates of a function of the resistance and/or a function of the inductance).

In step 710, the temperature estimation block 214 compares a ratio value derived from these estimates, e.g. the ratio $L_{EM}/R_{EM}$, to one or more reference values and/or applies a transfer function and, in step 612, determines an estimate of the temperature $T_{CM}$.

$T_{CM}$ is then passed on the to control block 218 which, in step 714, compares $T_{CM}$ to a threshold value and determines the the control signals CTRL_1 and/or CTRL_2 to be sent to the signal processing block 200 and the output driver amplifier 202.

The use of the ratio of the resistance to the inductance (or a ratio of a function of inductance to a function of resistance or equivalently a function of the ratio of the resistance to the inductance) at least partially overcomes the errors produced by a simple current sensing circuitry and attempting to derive the temperature of the voice coil from the resistance alone.

Embodiments of the present invention can be implemented with a variety of amplifier stages. FIG. 8 illustrates a class D output stage with current sensing circuitry in accordance with an aspect of the present invention.

In particular, the transistors M1-M4 form a full H-bridge class D output stage as will be appreciated by one skilled in the art with a speaker voice coil 204 connected between the nodes 800 and 802. The states of M1-M4 are controlled by respective gate control signals G1-G4. In some embodiments G1 and G3, and similarly G2 and G4, may be nominally identical, albeit maybe with some small underlap or overlap, so that at any one time either M1 and M3 or M2 and M4 are turned on. In other embodiments the gate nodes of the transistors M1-M4 could be driven by separate driving signals, to allow other combinations.

If M2 and M4 are on together, the current will flow through path $I_1$. If M1 and M3 are on together the current will flow through path $I_2$.

The transistors M5-M7, along with the amplifier A, provide the sensing circuitry for sensing the coil current $I_C$.

In order to sense the current $I_C$ flowing either through the path $I_1$ or $I_2$ sensing circuitry is needed. In this embodiment, the sensing circuitry is provided by the transistors M5-M7 and the amplifier A. The transistor M5, which in this embodiment is a NMOS, is a mirror device to the transistor M1. Therefore, when the transistor M1 is on and passing current, the same current will pass through the transistor M5.

Similarly, the transistor M6, which in this embodiment is a NMOS, is a mirror device to the transistor M4. Therefore, when the transistor M4 is on and passing current the same current will pass through the transistor M6.

Similarly to the arrangement shown in FIG. 3, the drain voltage of the mirror transistors is maintained at the same voltage as the driving transistors by the amplifier A and pass circuitry. The forces the same current, $I_C$ through the mirror transistors M5 and M6.

Therefore, when only one of M1 or M4 is on, the mirror current through the respective mirror transistor M5 or M6 is forced through the transistor M7 where it can then be output for further processing. In some embodiments the sensed current $I_{CM}$ is then output to an impedance extraction block 210.

In some embodiments the amplifier may be operable such that both the transistors M1 and M4 are on (and therefore, necessarily, M3 and M2 are off) at the same time. In such a case the current through the transistors M6 and M5 is equal and opposite, and therefore the switch SW can be in either configuration to sense the current through transistor M7.

In some embodiments the amplifier may be operable such that both the transistors M2 and M3 are on (and therefore, necessarily, M1 and M4 are off) at the same time. In this switch state there is no current through either transistor M1 or M4 and thus the current sensing circuitry illustrated in FIG. 8 would not be able to sense a current. In some embodiments, there may be further transistors added to mirror the transistors M2 and M3 in a similar way to how the transistors M5 and M6 mirror transistors M1 and M4. Hence if both transistors M2 and M3 are on (and therefore, necessarily, M1 and M4 are off) the current through the voice coil can still be sensed.

It will be appreciated however that instances of such a 'blind' switch state where the current sensing circuitry cannot directly sense the current will be alternated with other switch states where the current can be sensed. An alternative to providing a separate current mirror therefore would be to post process the sensed current detected in the other switch states so as to interpolate, for example, by using a polynomial or spline curve fit, or using low-pass filtering and/or a sample-and-hold arrangement, to determine the current in the blind state. In some embodiments however it may be sufficient to simply measure the current in the switch states where current can be measured and ignore the blind state.

The positive input of the amplifier A is connected to a switch SW which switches between connecting to a node $P_1$ between the drain nodes of the transistors M3 and M4, and connecting to a node $P_2$ between the drain nodes of the transistors M1 and M2.

When the transistors M4 and M2 are on and the transistors M1 and M3 are off, the current is following the path $I_1$ and the switch SW needs to be down to sense the current passing through the point $P_1$.

When the transistors M1 and M3 are on and the transistors M2 and M4 are off, the current is following the path $I_2$ and the switch SW needs to be up to sense the current passing through the point $P_2$.

In some embodiments, elements of the switch SW may be driven by driving signals selected from G1-G4 or by a separate driving signal GSW.

Figure 9:
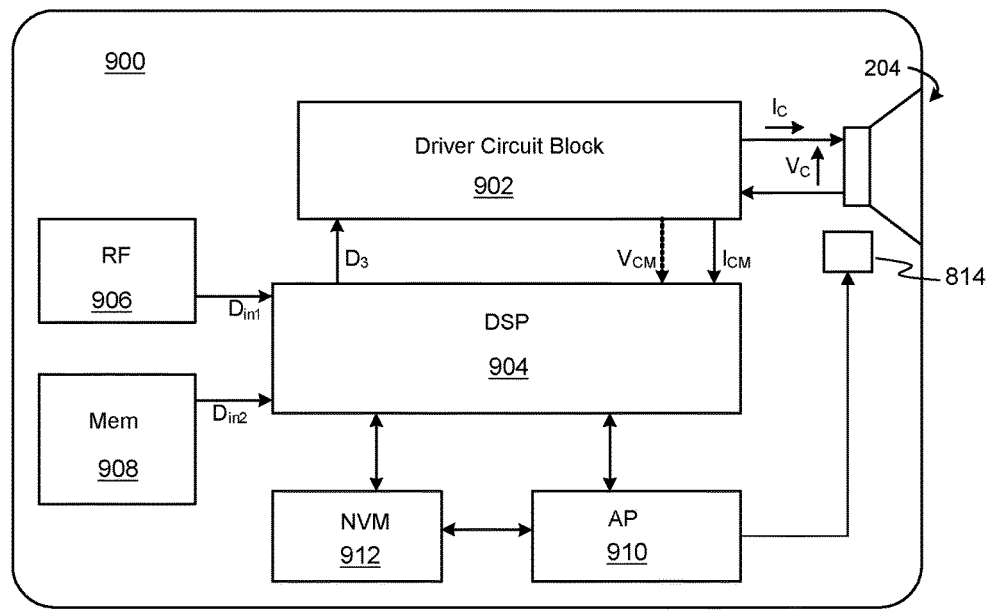
FIG. 9 illustrates a device according to some embodiments of the present invention

FIG. 9 shows a device according to some embodiments of the present invention.

In some embodiments of the invention the speaker protection circuitry described may be implemented in an electronic apparatus or device 900 as illustrated in FIG. 8, for example a mobile phone. The device 900 comprises a speaker 204 which is driven from a driver circuit block 902. The driver circuit block 902 receives a digital audio signal D3 and delivers a resultant voltage $V_C$ across the speaker.

The driver circuit block 902 may comprise a digital-to-analogue converter (which may be oversampled, for example, a delta sigma DAC) and an analogue output driver amplifier powerful enough to drive the impedance of the speaker. Alternatively, it may comprise a Class D amplifier, either half-bridge or full-bridge, with an analogue input from a DAC, or an all-digital Class D modulator. The driver circuit block may also include analogue signal processing.

The speaker current $I_C$ is monitored to provide a signal representative of this current. An analogue current sense signal $I_{CM}$ may be generated by lossless sensing circuitry as described above in reference to FIGS. 3 and 8, or by a sense resistor, either of which may be located close to the speaker or co-located with the amplifier. The amplifier may be inside the speaker package or may be a more remote power amplifier, either discrete or embedded in a more complex circuit, for example an audio codec integrated circuit. Whilst an analogue signal may be used to represent the speaker current, in some embodiments it may be preferred to provide a digital signal indicative of the sensed current. The sense buffer or digitising circuitry may, in that case, be provided as part of the local speaker driver circuit block 902.

A digital speaker current signal $I_{CM}$ may be provided along with a digital signal $V_{CM}$ representative of the voltage across the voice coil of the speaker $V_C$. Where the driver circuit block 902 includes analogue processing the driver circuit block 902 may include an analogue-to-digital convertor to deliver the signal $V_{CM}$. However, in many cases, the signal D3 may be an adequate estimate of $V_C$.

A digital signal processing (DSP) 904 block implements the speaker protection control module 208. The DSP 904 block may receive an audio digital input signal $D_{IN}$ intended for the speaker 204. This could, for example, be an audio signal $D_{IN1}$ received from an interface 906, for example a RF radio/wireless interface or modem. In this case, the audio signal could be received audio for a voice/video call and/or streaming media. At other times the input could be an audio signal $D_{IN2}$, which may be received from some data storage 908, for example, disk storage, either mechanical or solid state, or some other semiconductor memory. This storage may be a permanent part of the device 900 or may be attachable storage such as a memory card of USB stick or the like. The DSP 904 includes a gain stage to apply gain to the input signal $D_{IN}$ and also possible further DSP or multiplier blocks to perform further signal processing to generate the digital signal D3 supplied to the driver block 902.

The speaker protection control module 208 may be implemented by software code running on the DSP 904. This software code may be stored in the device 900 as firmware on some non-volatile memory, e.g. EEPROM (which may preserve the program data when the battery becomes discharged or is removed for replacement).

The relevant software for running the speaker protection module 208 may be loaded into the DSP 904 on power-up which could be, for example, the awakening of the device 900 from a standby mode, or on start-up of the speaker driver function, e.g. on the receipt of a user command to start outputting from the speaker 204.

A separate processor, for example an applications processor 910 may control this start up.

In some applications at least some audio data, for example playback material or pilot tones, may be provided from the NVM 912, either directly, or via the applications processor 910.

As mentioned previously, in some embodiments the speaker protection control module may determine the resistance or inductance of the voice coil or their ratio based on a reference value which may be determined on device start-up. In such embodiments the ambient temperature may be sensed by a temperature sensor 914 in order to infer the voice coil temperature on start-up. In some devices 900 a temperature sensor may be present for other reasons anyway and may be used for this purpose, for example, providing ambient temperature data to the applications processor 910 as illustrated. In other embodiments, however, the ambient temperature data could be provided directly to the DSP 904.

It will of course be appreciated that the various block illustrated in FIG. 10 or parts thereof may be co-integrated with the other blocks or parts thereof, or with functions of the host device. For example, the DSP 904 and the driver circuit block 902 may be co-integrated into an Audio Hub.

The skilled person will thus recognise that some aspects of the above described apparatus and methods, for example, the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog TM or VHDL. AS the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more speakers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example. Embodiments of the invention may also be implemented wholly or partially in accessories attachable to a host device, for example, in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A method of determining a temperature of a voice coil of a loudspeaker comprising:
    driving the voice coil with signal components at first and second frequencies, wherein the first frequency is higher than the second frequency and wherein the second frequency is different from a mechanical resonance frequency of the loudspeaker, and determining first and second indications of current and voltage of the voice coil at said first and second frequencies respectively;
    determining an estimated ratio value using the first and second indications of current and voltage wherein said estimated ratio value corresponds to a ratio between a value based on a resistance of the voice coil and a value based on an inductance of the voice coil; and
    determining the temperature of the voice coil based on said estimated ratio value and at least one reference value.

2. A method as claimed in claim 1 wherein the first frequency is higher than a resistance-inductance time constant of the voice coil.

3. A method as claimed in claim 2 wherein the first indication of current and voltage of the voice coil at the first frequency is used to determine the inductance of the voice coil.

4. A method as claimed in claim 2 wherein determining the estimated ratio value comprises:
    determining a first value of impedance $Z_H$ based on the first indication of current and voltage of the voice coil; and
    determining the inductance $L_E$ of the voice coil from the first value of impedance $Z_H$ using a relationship $L_E=Z_H/2_\pi \cdot f_H$ where $f_H$ is the first frequency.

5. A method as claimed in claim 1 wherein the second frequency is lower than a resistance-inductance time constant of the voice coil.

6. A method as claimed in claim 5 wherein the second indication of current and voltage of the voice coil at the second frequency is used to determine the resistance of the voice coil.

7. A method as claimed in claim 5 wherein determining the estimated ratio value comprises:
    determining a second value of impedance $Z_L$ based on the second indication of current and voltage of the voice coil; and
    determining the resistance $R_E$ of the voice coil from the second value of impedance $Z_L$ using a relationship $R_E=Z_L$.

8. A method as claimed in claim 1 wherein the second frequency is below the mechanical resonance frequency of the loudspeaker.

9. A method as claimed in claim 1 wherein the second frequency is above the mechanical resonance frequency of the voice coil.

10. A method as claimed in claim 1 comprising receiving at least one signal indicative of the current in the voice coil and determining said first and second indications of current and voltage of the voice coil at said first and second frequencies respectively from said at least one signal.

11. A method as claimed in claim 10 wherein the current in the voice coil is sensed using a lossless current sensing circuit.

12. A method as claimed in claim 1 wherein the step of determining said first and second indications of current and voltage comprises receiving at least one signal indicative of the voltage in the voice coil at the first and second frequencies.

13. A method as claimed in claim 12:
    wherein driving the voice coil with the signal components at the first and second frequencies comprises providing a drive signal to the voice coil, the drive signal corresponding to a first audio signal; and
    wherein said at least one signal indicative of the voltage in the voice coil at the first and second frequencies is based on said first audio signal.

14. A method as claimed in claim 13 wherein said first audio signal is a digital signal and is used as said signal indicative of the voltage in the voice coil.

15. A method as claimed in claim 1 wherein driving the voice coil with the signal components at the first and second frequencies comprises sequentially driving the voice coil with pilot tone signals at the first and second frequencies.

16. A method as claimed in claim 1 wherein driving the voice coil with the signal components at the first and second frequencies comprises driving the voice coil with a drive signal comprising frequency components at the first and second frequencies.

17. A method as claimed in claim 1:
    wherein driving the voice coil with the signal components at the first and second frequencies comprises providing a drive signal to the voice coil, the drive signal corresponding to a first audio signal representing audio content which is not specifically generated for allowing temperature measurement; and
    wherein said first and second frequencies correspond to frequency components expected and/or detected in said first audio signal.

18. A method as claimed in claim 16 wherein determining said first and second indications of current and voltage comprises monitoring the voice coil current and isolating from said monitored voice coil current first and second current components at said first and second frequencies respectively.

19. A method as claimed in claim 18 wherein isolating said first and second current components comprises filtering said monitored voice coil current.

20. A method as claimed in claim 1 further comprising generating at least one control signal for adjusting a gain applied to an audio signal path upstream of the voice coil based on the determined temperature of the voice coil.

21. A method as claimed in claim 1 further comprising a calibration step comprising:
    receiving an indication of the temperature of the voice coil from a temperature sensor;
    driving the voice coil at the first and second frequencies and determining the first and second indications of current and voltage of the voice coil;
    determining the estimated ratio value using the first and second indications of current and voltage; and
    using the estimated ratio value and the indication of the temperature to generate or modify at least one reference value.

22. A method as claimed in claim 1 wherein said estimated ratio value corresponds to the ratio of the inductance of the voice coil to the resistance of the voice coil.

23. A method as claimed in claim 1 wherein said estimated ratio value corresponds to the ratio of the square of the inductance of the voice coil to the square of the resistance of the voice coil.

24. A system for determining a temperature of a voice coil of a loudspeaker comprising:
    at least one input for receiving at least one signal indicative of current and voltage through the voice coil when the voice coil is being driven with signal components at first and second frequencies, the first frequency being greater than the second frequency and the second frequency being different from a mechanical resonance frequency of the loudspeaker;
    an impedance extraction module configured to receive said at least one signal indicative of the current and voltage through the voice coil and determine a first impedance value of the voice coil at the first frequency and a second impedance value of the voice coil at the second frequency;
    a ratio estimation module configured to determine an estimated ratio value corresponding to a ratio between a value based on a resistance of the voice coil and a value based on an inductance of the voice coil based on said first and second impedance values; and
    a temperature estimation module configured to determine an estimated temperature of the voice coil based on the estimated ratio value and at least one reference value.

25. A system as claimed in claim 24 wherein said estimation module is configured to determine a value corresponding to the inductance $L_E$ of the voice coil from the first value of impedance $Z_H$ using a relationship $L_E = Z_H / 2_\pi \cdot f_H$ where $f_H$ is the first frequency.

26. A system as claimed in claim 24 wherein said estimation module is configured to determine a value corresponding to the resistance $R_E$ of the voice coil from the second value of impedance $Z_L$ using a relationship $R_E = Z_L$.

27. A system as claimed in claim 24 further comprising a signal processing block disposed in a signal path for audio signals for driving the loudspeaker.

28. A system as claimed in claim 27 wherein said signal processing block is operable to generate an audio signal for driving the loudspeaker comprising said first and second frequencies.

29. A system as claimed in claim 28 wherein said signal processing block is configured to generate an audio signal comprising sequential first and second pilot tones at said first and second frequencies respectively.

30. A system as claimed in claim 28 wherein said signal processing block is configured to generate an audio signal comprising simultaneous frequency components at the first and second frequencies.

31. A system as claimed in claim 28 wherein said first frequency is above a resistance-inductance time constant of the voice coil and the second frequency is below the resistance-inductance time constant of the voice coil.

32. A system as claimed in claim 24 wherein the impedance extraction module comprises at least one filter for filtering the at least one signal indicative of the current and voltage through the voice coil to isolate current and/or voltage components at the first and second frequencies.

33. A system as claimed in claim 24 further comprising current sensing circuitry for sensing the current through the voice coil and providing the signal indicative of the current through the voice coil to the impedance extraction module.

34. A system as claimed in claim 33 wherein said current sensing circuitry comprises lossless sensing circuitry.

35. A system as claimed in claim 24 further comprising a control module for generating at least one control signal depending on the determined temperature of the voice coil.

36. A system as claimed in claim 35 wherein said at least one control signal comprises a gain control signal for modulating a gain applied to an audio signal in a signal path upstream of the loudspeaker.

37. A system as claimed in claim 34 wherein the signal processing block imparts a gain on the input signal to the drive signal.

38. A system as claimed in claim 24 wherein at least one of said impedance extraction module and said ratio estimation module comprises a processor configured to execute code stored in a memory.

39. A system as claimed in claim 24, further comprising the loudspeaker.

40. An electronic apparatus comprising the system as claimed in claim 24.

41. An electronic apparatus as claimed in claim 40 wherein said apparatus is at least one of: a portable device; a battery power device; a computing device; a communications device; a gaming device; a mobile telephone; a personal media player; a laptop, tablet or notebook computing device.

42. Software code stored on a non-transitory storage medium which, when run on a suitable processor, performs the method of claim 1.

43. Software code as claimed in claim 42 wherein said software code is stored in memory of an electronic device.

44. An electronic device comprising memory containing software code and a suitable processor for performing the method of claim 1.

45. A system for determining a temperature of a voice coil of a loudspeaker, the system comprising a processor and a memory, said memory containing instructions executable by said processor whereby said system is operative to:
    receive first and second indications of current and voltage of the voice coil when the voice coil is being driven with signal components at first and second frequencies respectively, the first frequency being greater than the second frequency and the second frequency being different from a mechanical resonance frequency of the loudspeaker;

determine an estimated ratio value using said first and second indications of current and voltage wherein said estimated ratio value corresponds to a ratio between a value based on a resistance of the voice coil and a value based on an inductance of the voice coil; and determine the temperature of the voice coil based on said estimated ratio value and at least one reference value.

46. An apparatus for monitoring a temperature of a voice coil of a loudspeaker comprising:

a first module for determining a first value corresponding to a ratio of a value based on a resistance of the voice coil and a value based on an inductance of the voice coil, wherein the ratio is based on voltages and/or currents associated with the voice coil at first and second frequencies, wherein the first frequency is greater than the second frequency, and wherein the second frequency is different from a mechanical resonance frequency of the loudspeaker; and a second module for determining the temperature of the voice coil.

47. An apparatus as claimed in claim 46 wherein the first module is configured to determine a value of the resistance of the voice coil based on an impedance of the voice coil to a driving signal at a frequency below a resistance-inductance time constant of the voice coil.

48. An apparatus as claimed in claim 46 wherein the first module is configured to determine a value of the inductance of the voice coil based on an impedance of the voice coil to a driving signal at a frequency above a resistance-inductance time constant of the voice coil.

49. An apparatus for determining a temperature of a voice coil of a loudspeaker comprising:

a first module for determining an impedance of the voice coil at a first driving frequency and a second, different, driving frequency, wherein the second driving frequency is different from a mechanical resonance frequency of the loudspeaker; and a second module for determining the temperature of the voice coil based on the determined impedances at said first and second driving frequencies.

50. A method for determining a temperature of a voice coil of a loudspeaker comprising:

estimating the voice coil temperature based on a value dependent on a ratio of estimated inductance and resistance, said ratio being derived from coil current and voltage components at at least two signal frequencies, wherein the first of the at least two signal frequencies is greater than a second of the at least two signal frequencies, and wherein the second of the at least two signal frequencies is different from a mechanical resonance frequency of the loudspeaker.

* * * * *

UNITED STATES PATENT AND TRADEMARK OFFICE
CERTIFICATE OF CORRECTION

PATENT NO. : 10,149,050 B2  
APPLICATION NO. : 15/315845  
DATED : December 4, 2018  
INVENTOR(S) : John Paul Lesso Page 1 of 1

It is certified that error appears in the above-identified patent and that said Letters Patent is hereby corrected as shown below:

In the Specification

1. In Column 3, Line 22, delete "base on" and insert -- based on --, therefor.

2. In Column 3, Line 32, delete "voltage; and" and insert -- voltage, and --, therefor.

3. In Column 3, Line 44, delete "comprising;" and insert -- comprising: --, therefor.

4. In Column 4, Line 40, delete "be implement" and insert -- be implemented --, therefor.

5. In Column 5, Line 49, delete "current." and insert -- current; --, therefor.

6. In Column 5, Line 62, delete "invention" and insert -- invention. --, therefor.

7. In Column 9, Line 47, delete "applied any" and insert -- applied to any --, therefor.

8. In Column 13, Line 19, delete "$L_E R_E$" and insert -- $L_E/R_E$ --, therefor.

9. In Column 15, Line 47, delete "impedance extraction block 208" and insert -- impedance extraction block 210 --, therefor.

10. In Column 15, Line 65, delete "the the control" and insert -- the control --, therefor.

Signed and Sealed this  
Second Day of April, 2019

Andrei Iancu  
*Director of the United States Patent and Trademark Office*